(12) United States Patent
Upadhyaya et al.

(10) Patent No.: US 10,623,008 B2
(45) Date of Patent: Apr. 14, 2020

(54) RECONFIGURABLE FRACTIONAL-N FREQUENCY GENERATION FOR A PHASE-LOCKED LOOP

(71) Applicant: Xilinx, Inc., San Jose, CA (US)

(72) Inventors: Parag Upadhyaya, Los Gatos, CA (US); Adebabay M. Bekele, San Jose, CA (US); Didem Z. Turker Melek, Campbell, CA (US); Zhaoyin D. Wu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 271 days.

(21) Appl. No.: 14/700,695

(22) Filed: Apr. 30, 2015

(65) Prior Publication Data

US 2016/0322979 A1  Nov. 3, 2016

(51) Int. Cl.
*H03L 7/095* (2006.01)
*H03L 7/18* (2006.01)
*H03L 7/197* (2006.01)
*H03M 3/00* (2006.01)
*H04B 1/50* (2006.01)

(52) U.S. Cl.
CPC ............... *H03L 7/095* (2013.01); *H03L 7/18* (2013.01); *H03L 7/197* (2013.01); *H03L 7/1974* (2013.01); *H03M 3/30* (2013.01); *H04B 1/50* (2013.01)

(58) Field of Classification Search
CPC ............. H03L 7/095; H03M 3/30; H04B 1/50
See application file for complete search history.

(56) References Cited

U.S. PATENT DOCUMENTS

| | | | | |
|---|---|---|---|---|
| 5,872,532 A * | 2/1999 | Yasuda | ............... | H03M 1/0668 341/143 |
| 6,567,027 B2 * | 5/2003 | May | ................... | H03H 17/0621 341/143 |
| 6,584,162 B1 * | 6/2003 | Tinker | ............... | H03H 17/0671 370/545 |
| 6,873,213 B2 * | 3/2005 | Tsuda | ................... | H03L 7/1976 331/1 A |

(Continued)

FOREIGN PATENT DOCUMENTS

WO 20070147132 12/2007

OTHER PUBLICATIONS

White, Joey, Noise Shaping in MASH Delta-Sigma Converters, Hephaestus Audio, 2009.*

Primary Examiner — Berhanu Tadese
(74) Attorney, Agent, or Firm — Patterson + Sheridan, LLP (57) ABSTRACT

In an example, a phase-locked loop (PLL) circuit includes an error detector operable to generate an error signal; an oscillator operable to provide an output signal having an output frequency based on the error signal and a frequency band select signal, the output frequency being a frequency multiplier times a reference frequency; a frequency divider operable to divide the output frequency of the output signal to generate a feedback signal based on a divider control signal; a sigma-delta modulator (SDM) operable to generate the divider control signal based on inputs indicative of an integer value and a fractional value of the frequency multiplier, the SDM responsive to an order select signal operable to select an order of the SDM; and a state machine operable to, in an acquisition state, generate the frequency band select signal and set the order of the SDM.

20 Claims, 7 Drawing Sheets

(56) References Cited

U.S. PATENT DOCUMENTS

| | | | |
|---|---|---|---|
| 6,944,257 B2* | 9/2005 | Riley | H03L 7/081 327/115 |
| 7,042,970 B1* | 5/2006 | Keaveney | H03D 13/00 375/371 |
| 7,274,229 B1* | 9/2007 | Humphreys | H03L 7/10 327/156 |
| 7,280,056 B2* | 10/2007 | Puma | H03M 7/3022 341/143 |
| 7,388,939 B2* | 6/2008 | Dubash | G06F 7/68 327/105 |
| 7,405,685 B2* | 7/2008 | Rezeq | H03F 1/0205 341/118 |
| 7,439,812 B1 | 10/2008 | Lombaard et al. | |
| 7,554,472 B2* | 6/2009 | Puma | H03M 7/3022 341/143 |
| 7,649,428 B2* | 1/2010 | Reddy | H03L 7/1976 331/16 |
| 7,804,367 B2* | 9/2010 | Lee | H03L 7/087 327/156 |
| 8,010,072 B1 | 8/2011 | Nathawad | |
| 8,258,835 B1* | 9/2012 | Morand | H03L 7/1976 327/147 |
| 8,299,826 B2* | 10/2012 | Perrott | H03H 19/008 327/156 |
| 8,339,165 B2* | 12/2012 | Dunworth | H03L 7/089 327/152 |
| 8,451,067 B2* | 5/2013 | Morand | H03M 7/3004 327/156 |
| 8,587,352 B2* | 11/2013 | Koerner | H03L 7/1976 327/147 |
| 8,604,955 B2* | 12/2013 | Oishi | H04L 27/04 341/118 |
| 8,829,959 B2* | 9/2014 | Perrott | H03H 19/008 327/158 |
| 8,836,391 B2* | 9/2014 | Upadhyaya | H04L 27/0014 327/147 |
| 8,841,948 B1* | 9/2014 | Chien | H03L 7/081 327/149 |
| 8,866,519 B1* | 10/2014 | Hiebert | H03L 7/1976 327/147 |
| 8,884,672 B2* | 11/2014 | Ballantyne | H03L 7/089 327/157 |
| 8,953,730 B2* | 2/2015 | Chen | H03L 7/101 375/376 |
| 9,116,769 B2* | 8/2015 | Staszewski | G06F 17/10 |
| 9,203,417 B1* | 12/2015 | Perrott | H03H 19/008 |
| 9,484,936 B2* | 11/2016 | Waheed | H03M 7/165 |
| 9,722,659 B2* | 8/2017 | Unhold | H04B 1/69 |
| 10,348,310 B1* | 7/2019 | Megawer | H03L 7/0805 |
| 2002/0061086 A1* | 5/2002 | Adachi | H03L 7/1976 375/376 |
| 2002/0145546 A1* | 10/2002 | May | H03H 17/0621 341/61 |
| 2002/0145547 A1* | 10/2002 | May | H03H 17/0621 341/61 |
| 2003/0062959 A1* | 4/2003 | Tsuda | H03L 7/1976 331/17 |
| 2003/0085768 A1* | 5/2003 | Bronson | H03L 7/06 331/100 |
| 2003/0219091 A1* | 11/2003 | Riley | H03L 7/081 377/47 |
| 2005/0186920 A1* | 8/2005 | Staszewski | H03L 7/16 455/114.1 |
| 2007/0008199 A1* | 1/2007 | Rezeq | H03F 1/0205 341/118 |
| 2007/0085579 A1* | 4/2007 | Wallberg | H03L 7/08 327/156 |
| 2008/0042886 A1* | 2/2008 | Li Puma | H03M 7/3022 341/143 |
| 2008/0068236 A1* | 3/2008 | Sheba | G04F 10/005 341/118 |
| 2008/0072025 A1* | 3/2008 | Staszewski | G06F 9/30032 712/241 |
| 2008/0106340 A1* | 5/2008 | Lee | H03L 7/087 331/16 |
| 2008/0157884 A1* | 7/2008 | Lee | H03L 7/113 331/44 |
| 2008/0231381 A1* | 9/2008 | Reddy | H03L 7/1976 331/1 A |
| 2009/0070568 A1* | 3/2009 | Shi | G06F 9/30003 712/237 |
| 2009/0325494 A1* | 12/2009 | Staszewski | H03L 7/085 455/43 |
| 2011/0050301 A1* | 3/2011 | Perrott | H03H 19/008 327/156 |
| 2011/0050998 A1* | 3/2011 | Gao | H03L 7/0805 348/536 |
| 2011/0133799 A1* | 6/2011 | Dunworth | H03L 7/089 327/157 |
| 2011/0170628 A1* | 7/2011 | Oishi | H04L 27/04 375/295 |
| 2011/0175682 A1 | 7/2011 | Chen et al. | |
| 2011/0304365 A1* | 12/2011 | Bunch | H03L 7/1976 327/157 |
| 2012/0025882 A1* | 2/2012 | Shanan | H03L 7/0893 327/157 |
| 2012/0082151 A1* | 4/2012 | Liu | H03L 7/093 370/342 |
| 2012/0313722 A1* | 12/2012 | Morand | H03L 7/085 332/109 |
| 2013/0069696 A1* | 3/2013 | Koerner | H03L 7/1976 327/117 |
| 2013/0069729 A1* | 3/2013 | Perrott | H03H 19/008 331/25 |
| 2013/0181756 A1* | 7/2013 | Ballantyne | H03L 7/089 327/157 |
| 2014/0091843 A1* | 4/2014 | Upadhyaya | H04L 27/0014 327/157 |
| 2014/0218080 A1* | 8/2014 | Choke | H03L 7/083 327/148 |
| 2014/0240003 A1* | 8/2014 | Buch | H03L 7/089 327/12 |
| 2015/0002195 A1* | 1/2015 | Englekirk | H03L 7/0891 327/157 |
| 2016/0248430 A1* | 8/2016 | Waheed | H03M 3/422 |
| 2016/0277546 A1* | 9/2016 | Unhold | H04B 1/69 |

\* cited by examiner

RECONFIGURABLE FRACTIONAL-N FREQUENCY GENERATION FOR A PHASE-LOCKED LOOP

TECHNICAL FIELD

Examples of the present disclosure generally relate to electronic circuits and, in particular, to reconfigurable fractional-N frequency generation for a phase-locked loop (PLL).

BACKGROUND

A programmable integrated circuit (IC), such as a field programmable gate array (FPGA), can operate in a variety of modes. One particular mode of operation involves operating multiple transceivers in a programmable IC at different line rates that are not integer multiples of each other. For example, such a mode of operation arises when the programmable IC is used in communication applications in which data is received from multiple sources with different reference frequencies. Generation of clocks for transceivers operating at different line rates typically requires the use of multiple reference oscillators, which increases costs and consumes valuable input/output (IO) resources of the programmable IC. Further, there can be various different requirements for receiving data from the disparate sources at the programmable IC, such as different accuracy requirements.

SUMMARY

Techniques for providing reconfigurable fractional-N frequency generation for a phase-locked loop (PLL) are described. In an example, a PLL circuit includes an error detector operable to generate an error signal in response to comparison of a reference signal having a reference frequency and a feedback signal having a feedback frequency. The PLL circuit further includes an oscillator, coupled to the error detector, operable to provide an output signal having an output frequency based on the error signal and a frequency band select signal, the output frequency being a frequency multiplier times the reference frequency. The PLL circuit further includes a frequency divider, coupled to the oscillator, operable to divide the output frequency of the output signal to generate the feedback signal based on a divider control signal. The PLL circuit further includes a sigma-delta modulator (SDM), coupled to the frequency divider, operable to generate the divider control signal based on inputs indicative of an integer value and a fractional value of the frequency multiplier, the SDM responsive to an order select signal operable to select an order of the SDM. The PLL circuit further includes a state machine operable to, in an acquisition state, generate the frequency band select signal and set the order of the SDM through the order select signal.

In another example, an integrated circuit (IC) includes at least one transceiver, an input operable to receive a reference signal having a reference frequency from a reference oscillator, and a PLL coupled to each of the at least one transceiver. The PLL includes an error detector operable to generate an error signal in response to comparison of a reference signal having a reference frequency and a feedback signal having a feedback frequency. The PLL further includes an oscillator, coupled to the error detector, operable to provide an output signal having an output frequency based on the error signal and a frequency band select signal, the output frequency being a frequency multiplier times the reference frequency. The PLL further includes a frequency divider, coupled to the oscillator, operable to divide the output frequency of the output signal to generate the feedback signal based on a divider control signal. The PLL further includes a SDM, coupled to the frequency divider, operable to generate the divider control signal based on inputs indicative of an integer value and a fractional value of the frequency multiplier, the MASH SDM responsive to an order select signal operable to select an order of the MASH SDM. The PLL further includes a state machine operable to, in an acquisition state, generate the frequency band select signal and set the order of the SDM through the order select signal.

In another example, a method of operating a PLL circuit includes generating an error signal in response to comparison of a reference signal having a reference frequency and a feedback signal having a feedback frequency; controlling an oscillator to generate an output signal having an output frequency based on the error signal and a frequency band select signal, the output frequency being a frequency multiplier times the reference frequency; dividing the output frequency of the output signal to generate the feedback signal based on a divider control signal; generating the divider control signal using an SDM based on inputs indicative of an integer value and a fractional value of the frequency multiplier, the SDM responsive to an order select signal operable to select an order of the SDM; in an acquisition state, generating the frequency band select signal; and in the acquisition state, setting the order of the SDM through the order select signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing reconfigurable fractional-N frequency generation for a phase-locked loop (PLL) are described. Conventionally, multiple reference oscillators are required when operating multiple transceivers in an IC at different line rates. The PLL described herein can be used to generate clock signals for multiple transceivers using a single reference oscillator. The PLL is implemented using a fast acquisition and reconfigurable broadband fractional-N PLL. The PLL uses a programmable order sigma-delta modulator (SDM) and a fine divide ratio in order to lock the oscillator output to the local reference with high parts per million (PPM) accuracy. During acquisition, the PLL dynamically adjusts the order of the SDM to achieve fast acquisition. The PLL employs one or more wide-band oscillators, a frequency divider implemented using complementary metal oxide semiconductor (CMOS) logic and having pulse extension, a coarse tuning finite state machine (FSM) with automatic frequency band selection, and a reconfigurable SDM and charge pump with wide dynamic range to achieve wideband, low jitter fractional synthesis. These and other aspects are described below.

Figure 1:
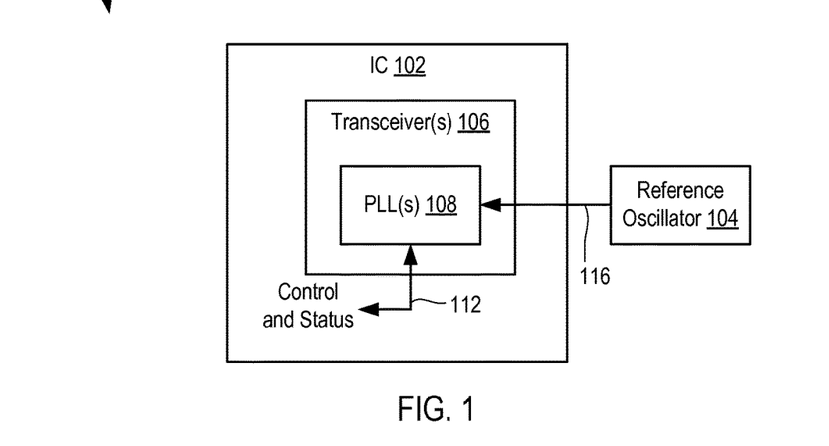
FIG. 1 is a block diagram depicting an example integrated circuit (IC) system.

FIG. 1 is a block diagram depicting an example integrated circuit (IC) system 100. The IC system 100 includes an IC 102 coupled to a reference oscillator 104. The IC 102 can be a programmable IC, such as a field programmable gate array (FPGA), complex programmable logic device (CPLD), or the like. Alternatively, the IC 102 can be a mask-defined IC, such an application specific integrated circuit (IC), application specific standard product (ASSP), or the like. The reference oscillator 104 can be a crystal oscillator or the like operable to output a reference signal having a reference frequency. Although a single reference oscillator 104 is shown, the IC 102 can be coupled to a plurality of reference oscillators 104.

The IC 102 includes one or more transceivers 106, which include one or more PLLs 108 (also referred to as PLL circuits 108). An input 116 of the PLL 108 is coupled to receive a reference signal from the reference oscillator 104. An input/output (IO) interface 112 of the PLL 108 is coupled to receive control signal(s) and provide status signal(s). Each of the PLL(s) 108 is coupled to provide an output signal having an output frequency to the transceiver(s) 106. The transceiver(s) 106 can use the output signal to send and/or receive data. An example of a PLL 108 is described below with respect to FIG. 2. In some examples, the IC 102 can include a plurality of PLLs 108, each outputting a different output frequency based on the single reference oscillator 104. As described herein, each PLL 108 provides for fast acquisition of a desired output frequency by dynamically adjusting a programmable order of an embedded sigma-delta modulator (SDM)-based multi-stage noise shaping (MASH) circuit. Each PLL 108 is reconfigurable over a wide operating frequency and provides a fine divide ratio (fractional-based) in order to lock the output signal to the reference signal with high parts per million (PPM) accuracy.

Figure 2:
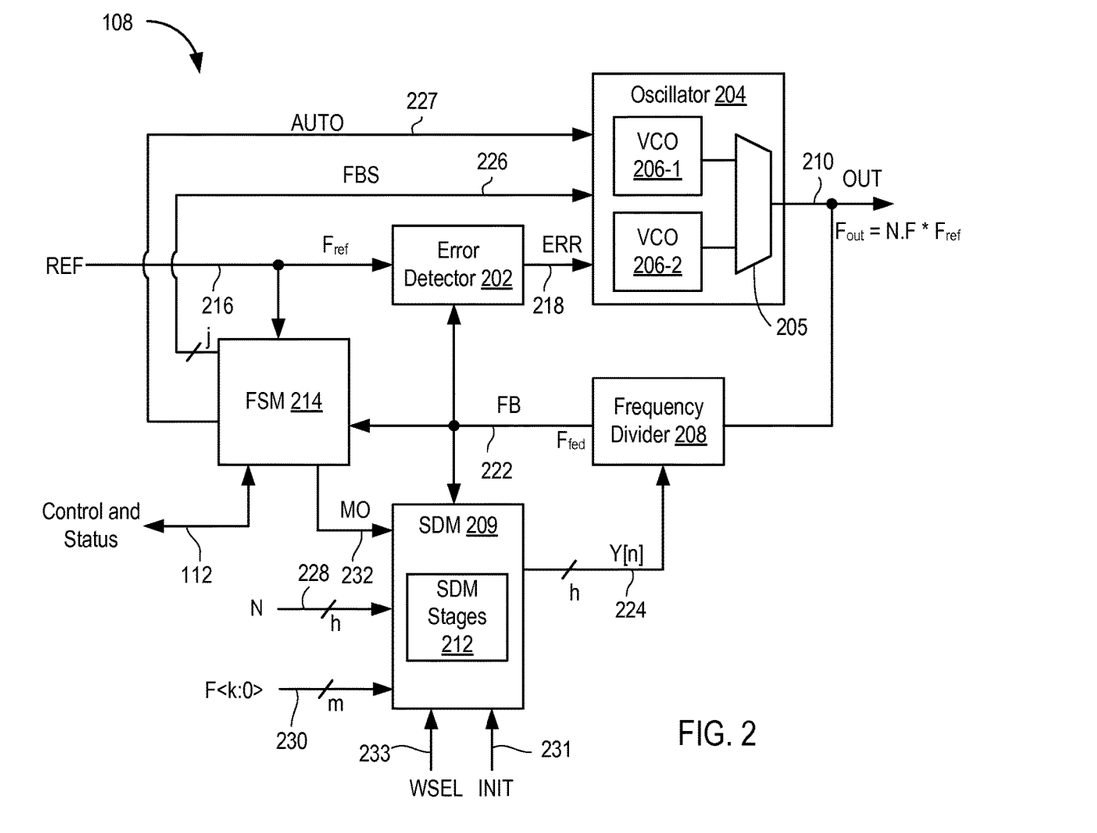
FIG. 2 is a block diagram depicting an example of a phase-locked loop (PLL) circuit.

FIG. 2 is a block diagram depicting an example of a PLL 108. The PLL 108 includes an error detector 202, an oscillator 204, a frequency divider 208, a sigma-delta modulator (SDM) 209, and a finite state machine (FSM) 214. An input 216 of the error detector 202 is coupled to receive a reference signal (REF) having a reference frequency ($F_{ref}$). For example, the error detector 202 can receive the reference signal REF from the reference oscillator 104. In another example, the reference signal REF can be derived from the reference signal output by the reference oscillator 104 (e.g., the reference signal output by the reference oscillator 104 can be multiplied or divided by an integer to generate the reference signal REF). The error detector 202 also receives a feedback signal (FB) having a frequency $F_{fed}$. The error detector 202 compares the reference frequency $F_{ref}$ and the feedback frequency $F_{fed}$ to generate an error signal (ERR) on an output 218. An example of the error detector 202 is described below with respect to FIG. 3.

An input of the oscillator 204 is coupled to the output 218 of the error detector 202. The oscillator 204 uses the error signal ERR to adjust the frequency of its oscillation. The oscillator 204 includes an output 210 coupled to provide an output signal (OUT) having a frequency $F_{out}$. For example, the output 210 can be the output of the PLL 108. Alternatively, the output 210 can be coupled to the output of the PLL 108 through one or more circuits (now shown). As described herein, the PLL 108 is structured such that the frequency $F_{out}$ is equal to N.F*$F_{ref}$, where "N" is an integer portion and ".F" is a fractional portion of a frequency multiplier "N.F". Stated differently, the ratio of the output frequency $F_{out}$ and the reference frequency $F_{ref}$ is equal to N.F.

The oscillator 204 can include one or more voltage controlled oscillators (VCOs) 206. In the example shown, the oscillator 204 includes two VCOs 206-1 and 206-2. The oscillator 204 can include a multiplexer 205. Inputs of the multiplexer 205 are coupled to outputs of the VCOs 206-1 and 206-2. An output of the multiplexer 205 is coupled to the output 210. While two VCOs 206-1 and 206-2 are shown in the example, the oscillator 204 can include more than two VCOs 206. In cases where the oscillator 204 includes only a single VCO 206, the multiplexer 205 is omitted.

In an example, each of the VCO(s) 206 includes inductor-capacitor (LC)-based oscillator having a voltage-adjustable capacitance (e.g., a varactor). Other types of VCO(s) 206 known in the art can be used. In an example, the oscillator 204 includes a plurality of frequency bands from which a particular frequency band can be selected. An input 226 of the oscillator 204 can receive a frequency band select signal (FBS) operable to select one of the frequency bands. The input 226 allows for coarse frequency selection by selecting one of the frequency bands. In an example, the oscillator 204 can include a plurality of VCOs 206, where each VCO is operable within one or more of the frequency bands (e.g., one or more high-band VCOs and one or more low-band VCOs). Another input 227 of the oscillator 204 can receive an automatic frequency band control signal (AUTO) operable to control whether the oscillator 204 operates in an automatic frequency band selection mode. This is especially beneficial to maximize the tuning range of the VCOs over PVT variation.

An input of the frequency divider 208 is coupled to the output 210 of the oscillator 204. Another input 224 of the frequency divider 208 is coupled to receive a divider control signal (Y[n]) from the SDM 209. The divider control signal (Y[n]) provides a divisor for the frequency divider 208 to use in dividing the frequency of the output signal. The divisor is dithered by the SDM 209 such that the divisor effectively becomes "N.F". The frequency divider 208 includes an output 222 that provides the feedback signal FB having the feedback frequency $F_{fed}$. The feedback frequency $F_{fed}$ effectively equals $F_{out}$/N.F. An example of the frequency divider 208 is described below with respect to FIG. 5.

The SDM 209 includes an input 228 coupled to receive an input signal N, and an input 230 coupled to receive an input signal F<k:0>. In the example, the input 228 is an h-bit input and the input 230 comprises an m-bit input, where m is a positive integer. The signal N provides an h-bit value representing an integer portion of the frequency multiplier. In one example, h=8, but h can be more or less than eight. The signal F<k:0> provides a value that dictates the fractional portion .F of the frequency multiplier, where k is less than m. In particular, the fractional portion of the frequency multiplier ".F" equals F<k:0>/2^k. In an example, the value k can be dynamically selected from a plurality of different widths. For example, if m=24 bits, then k can be selected to have a width of 12-bits, 16-bits, 20-bits, or 24-bits. The maximum width m can have other values greater than or less than 24 and the selectable widths k can be other than 12, 16, 20, and 24. In this manner, the number of significant digits for the fractional portion ".F" of the frequency multiplier, and hence the PPM accuracy of the PLL 108, can be increased or decreased by selecting a different width for values F<k:0>.

The SDM 209 can include a plurality of stages 212. In an example, each the stages 212 is itself a first-order SDM. The SDM stages 212 can be cascaded to realize a multi-stage noise shaping (MASH) structure having a programmable order. As such, each of the stages 212 is also referred to herein as a "MASH converter." The SDM 209 includes an input 232 coupled to receive an order select signal (MO). The SDM 209 selects an order based on the order select signal MO. For example, the SDM 209 can include three stages 212 and can select from a first order (1), a second order (1-1), and a third order (1-1-1). The SDM 209 can include other numbers of stages 212 greater than or less than three and thus can have different numbers of selectable orders. The SDM 209 outputs a value Y[n] for each cycle n of the feedback signal. In the present example, the value Y[n] includes h-bits. In an example, h=8 bits, but the output value Y[n] of the SDM 209 can have more or less than 8-bits. The SDM 209 can also include an input 231 to receive an initialization signal INIT. The initialization signal INIT can be used to initialize the stages 212 with initial conditions to reduce periodicity and improve spurious response. The SDM 209 can also include an input 233 to receive a width selection signal WSEL. The width selection signal WSEL can be used to select the width k of the input 230.

The SDM 209 includes an input coupled to receive the feedback signal FB from the output 222 of the frequency divider 208. In an example, the SDM 209 can also include an input coupled to receive the reference signal REF. The SDM 209 uses the feedback signal FB as a clock signal to produce different values Y[n] for each cycle of the feedback signal. The value of Y[n] varies between N−O to N+O+1, where O is the selected order (e.g., O=1, 2, or 3 for first, second, or third order, respectively) and N is the integer value on the input 228. The SDM 209 operates such that the average value of Y[n] is equal to N+F<k:0>/2^k. The frequency divider 208 uses the different values of Y[n] as divisors to divide the frequency $F_{out}$ of the output signal OUT and produce a frequency $F_{fed}$ of the feedback signal FB. In this manner, the frequency $F_{out}$ of the output signal OUT is effectively divided by N.F. An example of the SDM 209 is described below with respect to FIG. 7.

The FSM 214 includes an input coupled to the output 222 of the frequency divider 208 to receive the feedback signal FB. The FSM 214 includes another input coupled to receive the reference signal REF. The FSM 214 is coupled to the IO interface 112 to receive control signal(s) and provide status signal(s) for the PLL 108. The FSM 214 includes a j-bit output FBS coupled to the input 226 of the oscillator 204. The FSM 214 includes an output AUTO coupled to the input 227 of the oscillator 204. The FSM 214 includes an output MO coupled to an input 232 of the SDM 209.

In operation, the FSM 214 implements coarse frequency selection and provides a j-bit frequency band select signal FBS to the oscillator 204. In an example, j=5 and the oscillator 204 has 32 different coarse frequency bands from which to select. In other examples, j can be greater than or less than five and the oscillator 204 can have more than or less than 32 coarse frequency bands. The FSM 214 can include an "auto-select" mode in which the FSM 214 performs a binary hunt operation to find a suitable frequency band for the VCOs 206 based on comparison of $F_{ref}$ and $F_{fed}$. In such case, the PLL 108 receives a value N and a value F<k:0>, automatically acquires a lock to the reference frequency $F_{ref}$, and controls the output frequency $F_{out}$ to be N.F*$F_{ref}$. The FSM 214 can also support manual selection of a frequency band through input of a control signal on the IO interface 112. The FSM 214 can also track the lock status of the PLL 108 and output a lock signal on the IO interface 112. The FSM 214 can also receive an order select signal through the IO interface 112, which can be used to set the order of the SDM 209. In an example, the FSM 214 can dynamically adjust the order of the SDM 209 during an acquisition state to achieve fast acquisition. An example of the FSM 214 is discussed below with respect to FIG. 8.

Figure 3:
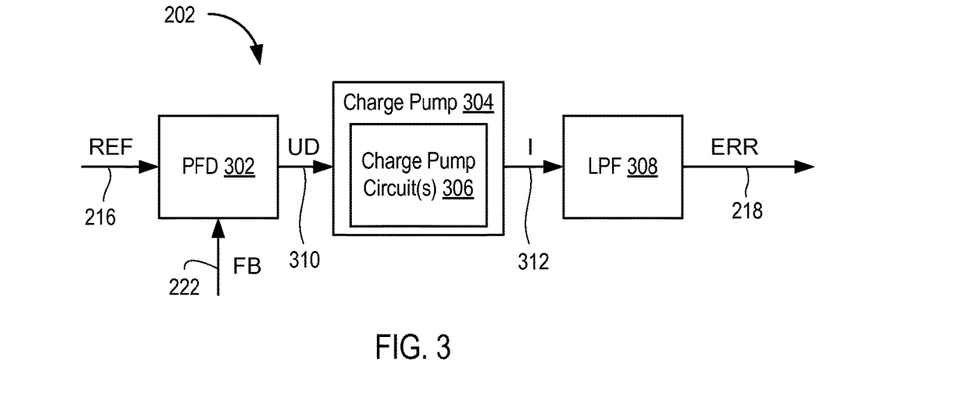
FIG. 3 is a block diagram depicting an example of an error detector for use with the PLL circuit of FIG. 2.

FIG. 3 is a block diagram depicting an example of the error detector 202. The error detector 202 includes a phase-frequency detector (PFD) 302, a charge pump 304, and a low-pass filter (LPF) 308. The PFD 302 includes an input coupled to the input 216 of the error detector 202, an input coupled to the output 222 of the frequency divider 208, and an output 310 coupled to an input of the charge pump 304. The charge pump 304 includes an output 312 coupled to an input of the LPF 308. The LPF 308 includes an output coupled to the output 218 of the error detector 202.

The PFD 302 compares the reference frequency $F_{ref}$ with the feedback frequency $F_{fed}$ and outputs up and down controls signals (UD) based on the difference in phase to activate the charge pump 304. When the phase difference is greater than ±2π, the PFD 302 controls the charge pump 304 to source or sink a constant current (I) depending on which of the reference frequency $F_{ref}$ and the feedback frequency $F_{fed}$ is higher. The PFD 302 controls the charge pump 304 to source a constant current (+I) if the reference frequency $F_{ref}$ is higher than the feedback frequency $F_{fed}$, and sink a constant current (−I) if the reference frequency $F_{ref}$ is lower than the feedback frequency $F_{fed}$. The LPF 308 integrates the current and outputs a continuously changing control voltage for the oscillator 204. Once the phase difference is less than $2\pi$, the PFD 302 controls the charge pump 304 so that the charge pump 304 is only active for a portion of each phase detector cycle that is proportional to the phase difference between the two signals. Once the phase difference between the two signals reaches zero, the PLL 108 enters the phase locked state.

The charge pump 304 can include one or more charge pump circuits 306 operable to supply or sink current in response to the up and down control signals UD from the PFD 302. If the charge pump 304 includes a plurality of charge pump circuits 306, some or all of the charge pump circuits 306 can be active and operate in parallel to source or sink current. The LPF 308 can include a resistive-capacitive (RC) circuit. In an example, the LPF 308 is a third-order RC circuit, although other types of circuits can be used to implement the LPF 308. An example of the LPF 308 is shown below in FIG. 4.

Figure 4:
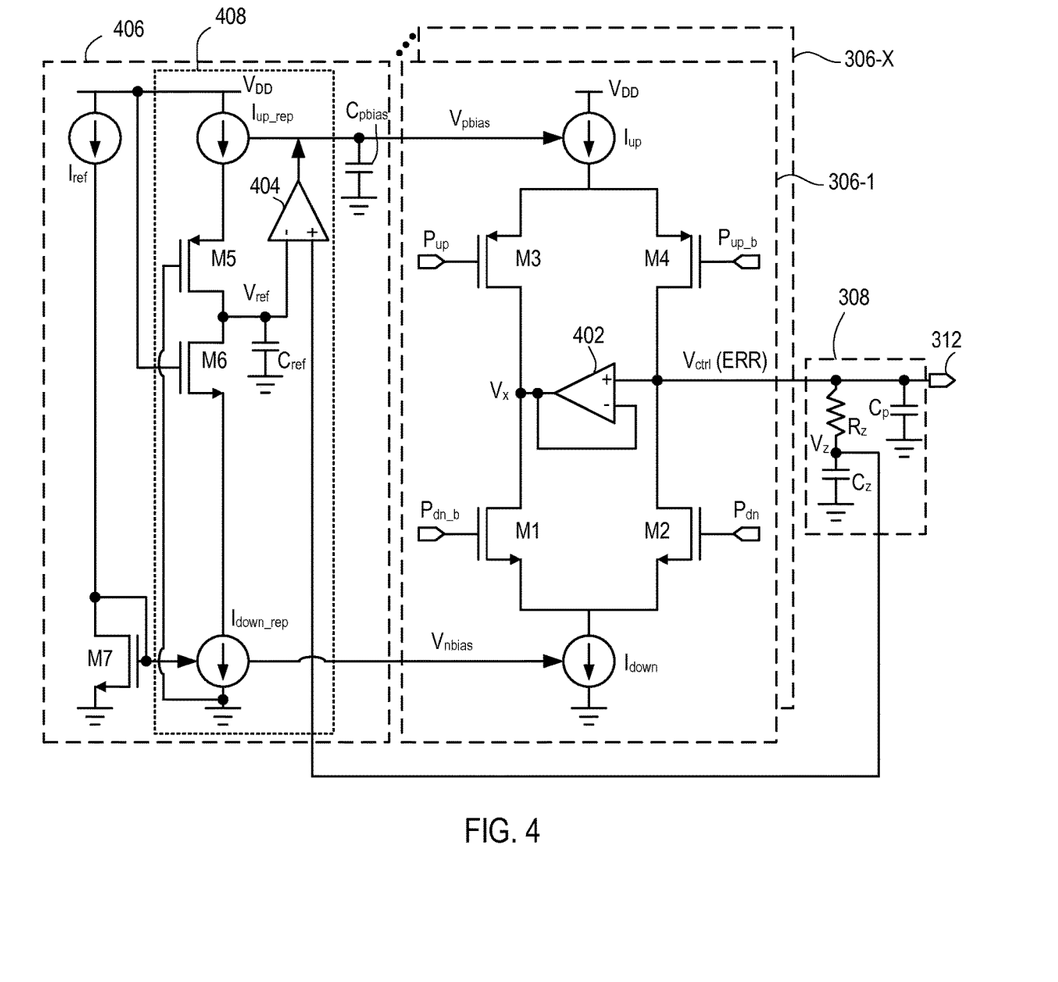
FIG. 4 is a schematic diagram depicting an example of a charge pump for use with the PLL circuit of FIG. 2.

FIG. 4 is a schematic diagram depicting an example of the charge pump 304. The charge pump 304 includes a plurality of charge pump circuits 306-1 through 306-X, where X is a positive integer. Each of the charge pump circuits 306 is configured similarly and those only the details of the charge pump circuit 306-1 are shown. The charge pump 304 further includes a bias circuit 406 that is shared among the charge pump circuits 306. Although a plurality of charge pump circuits 306 are shown, in other examples, the charge pump 304 can include a single charge pump circuit 306 configured as shown for the charge pump circuit 306-1.

The charge pump circuit 306-1 includes a pair of current sources $I_{up}$ and $I_{down}$, a current steering circuit formed by transistors M1 through M4, and a differential amplifier 402. The transistors M1 and M2 are n-channel field effect transistors (FETs), such as n-type metal oxide semiconductor FETs (MOSFETs). The transistors M3 and M4 are p-channel FETs, such as p-type MOSFETs.

Sources of the transistors M1 and M2 are coupled together. The current source $I_{down}$ is coupled between the sources of the transistors M1 and M2 and a reference voltage, such as electrical ground. The current source $I_{down}$ sinks current from the transistors M1 and M2. Gates of the transistors M1 and M2 are coupled to a differential input derived from the down control signal generated by the PFD 302. In particular, the gate of the transistor M2 is coupled to a true down control signal $P_{dn}$, and the gate of the transistor M1 is coupled to a complement down control signal $P_{dn\_b}$. A drain of the transistor M2 is coupled to the output 312 of the charge pump 304 (also referred to as a node $V_{ctrl}$). A drain of the transistor M1 is coupled to a node referred to as $V_x$. The nodes $V_{ctrl}$ and $V_x$ comprise ends of a differential output of the charge pump circuit 306-1. The node $V_{ctrl}$ provides the error signal ERR.

Sources of the transistors M3 and M4 are coupled together. The current source $I_{up}$ is coupled between the sources of the transistors M3 and M4 and a supply voltage $V_{dd}$. The current source $I_{up}$ supplies current to the transistors M3 and M4. Gates of the transistors M3 and M4 are coupled to a differential input derived from the up control signal generated by the PFD 302. In particular, the gate of the transistor M3 is coupled to a true up control signal $P_{up}$, and the gate of the transistor M4 is coupled to a complement up control signal $P_{up\_b}$. A drain of the transistor M4 is coupled to the output 312 of the charge pump 304. A drain of the transistor M3 is coupled to the node referred to as $V_x$.

The differential amplifier 402 is coupled between ends of the differential output of the charge pump circuit 306-1. In particular, a non-inverting input of the differential amplifier 402 is coupled to the node $V_{ctrl}$, and an inverting input of the differential amplifier 402 is coupled to the node $V_x$. An output of the differential amplifier 402 is coupled to the node $V_x$. As such, the differential amplifier 402 implements a unity gain buffer between ends of the differential output.

In the example, the LPF 308 comprises a resistor Rz in series with a capacitor Cz. The series combination of the resistor Rz and the capacitor Cz are coupled between the node $V_{ctrl}$ and the reference voltage (electrical ground). The series combination of the resistor Rz and the capacitor Cz is in parallel with a capacitor $C_p$. As such, the LPF 308 provides a third-order low-pass filter.

The bias circuit 406 includes current sources $I_{ref}$, $I_{up\_rep}$, and $I_{down\_rep}$, transistors M5, M6, and M7, capacitors $C_{ref}$ and $C_{bias}$, and a differential amplifier 404. The transistor M7 is an N-channel FET, such as an n-type MOSFET. A drain of the transistor M7 is coupled to a gate of the transistor M7 (e.g., M7 is "diode-connected"). A source of the transistor M7 is coupled to the reference voltage (electrical ground). The current source $I_{ref}$ is coupled between the supply voltage $V_{dd}$ and the drain of the transistor M7. The current source $I_{ref}$ supplies current to the drain of the transistor M7. The gate of the transistor M7 provides a bias voltage for the current source $I_{down\_rep}$.

The current sources $I_{up\_rep}$ and $I_{down\_rep}$, the transistors M5 and M6, the capacitor $C_{ref}$, and the differential amplifier 404 form a reference circuit 408. The transistor M5 is a p-channel FET, such as a p-type MOSFET. The transistor M6 is an n-channel FET, such as an n-type MOSFET. Drains of the transistors M5 and M6 are coupled together to form a node $V_{ref}$. A gate of the transistor M5 is coupled to the reference voltage (electrical ground). A gate of the transistor M6 is coupled to the supply voltage $V_{dd}$. The current source $I_{up\_rep}$ is coupled between the supply voltage $V_{dd}$ and a source of the transistor M5. The current source $I_{up\_rep}$ supplies current to the source of the transistor M5. The current source $I_{down\_rep}$ is coupled between the source of the transistor M6 and the reference voltage (electrical ground). The current source $I_{down\_rep}$ sinks current from the transistor M6. The current supplied by the current source $I_{up\_rep}$ generates a bias voltage $V_{pbias}$ for the current source $I_{up}$ in the charge pump circuit 306-1. The current sinked by the current source $I_{down\_rep}$ generates a bias voltage $V_{nbias}$ for the current source $I_{down}$ in the charge pump circuit 306-1.

The capacitor $C_{ref}$ is coupled between the node $V_{ref}$ and the reference voltage (electrical ground). An inverting input of the differential amplifier 404 is coupled to the node $V_{ref}$. A non-inverting input of the differential amplifier 404 is coupled to a node $V_z$ between the resistor Rz and the capacitor Cz in the LPF 308. An output of the differential amplifier 404 is coupled to the node $V_{pbias}$. The capacitor $C_{pbias}$ is coupled between the node $V_{nbias}$ and the reference voltage (electrical ground).

In operation, the current source $I_{ref}$ supplies a reference current that is mirrored by the current sources $I_{up\_rep}$ and $I_{down\_rep}$. The current sources $I_{up}$ and $I_{down}$ are biased to mirror the current sources $I_{up\_rep}$ and $I_{down\_rep}$, respectively. The transistors M5 and M6 are on and conduct a current $I_{ref}$ to generate the node voltage $V_{ref}$. Ideally, the current supplied by the current source $I_{up}$ and the current sinked by the current source $I_{down}$ match. However, in practical application, process mismatches between the current sources $I_{up}$ and $I_{down}$ result in small mismatches in the currents. Any mismatch in current between the sources $I_{up}$ and $I_{down}$ will result in a small difference between the node voltages $V_z$ and $V_{ref}$. The differential amplifier 404 adjusts the node voltage $V_{pbias}$ in response, causing an adjustment in the current supplied by the current source $I_{up}$. Using this feedback mechanism, the differential amplifier 404 drives the current source $I_{up}$ to match the current source $I_{down}$. The capacitor $C_{pbias}$ filters high-frequency changes in the node voltage $V_{pbias}$. The bias circuit 406 can provide the bias voltages $V_{pbias}$ and $V_{nbias}$ to one or more of the charge pump circuits 306.

The charge pump circuit 306-1 operates by sourcing or sinking current to or from the LPF 308. When the PFD 302 asserts the up control signal (logic high), the transistor M3 turns off and the transistor M4 turns on. When the up control signal is asserted, the down control signal is de-asserted (logic low). Thus, the transistor M1 turns on and the transistor M2 turns off. As such, current supplied by the current source $I_{up}$ is supplied to the LPF 308 through the transistor M4.

Conversely, when the PFD 302 asserts the down control signal, the transistor M2 turns on and the transistor M1 turns off. When the down control signal is asserted, the up control signal is de-asserted. Thus, the transistor M3 turns on and the transistor M4 turns off. As such, the current source $I_{down}$ draws current from the LPF 308 through the transistor M2.

When the PFD 302 de-asserts both the up and down control signals, transistors M4 and M2 are off and transistors M3 and M1 are on. As such, the charge pump circuit 306-1 does not supply or sink current to or from the LPF 308. The differential amplifier 402 operates to equalize the node voltages $V_x$ and $V_{ctrl}$. Thus, the charge pump circuit 306-1 will reject common-mode input (e.g., common-mode noise) as the up and down control signals are asserted and de-asserted.

Figure 5:
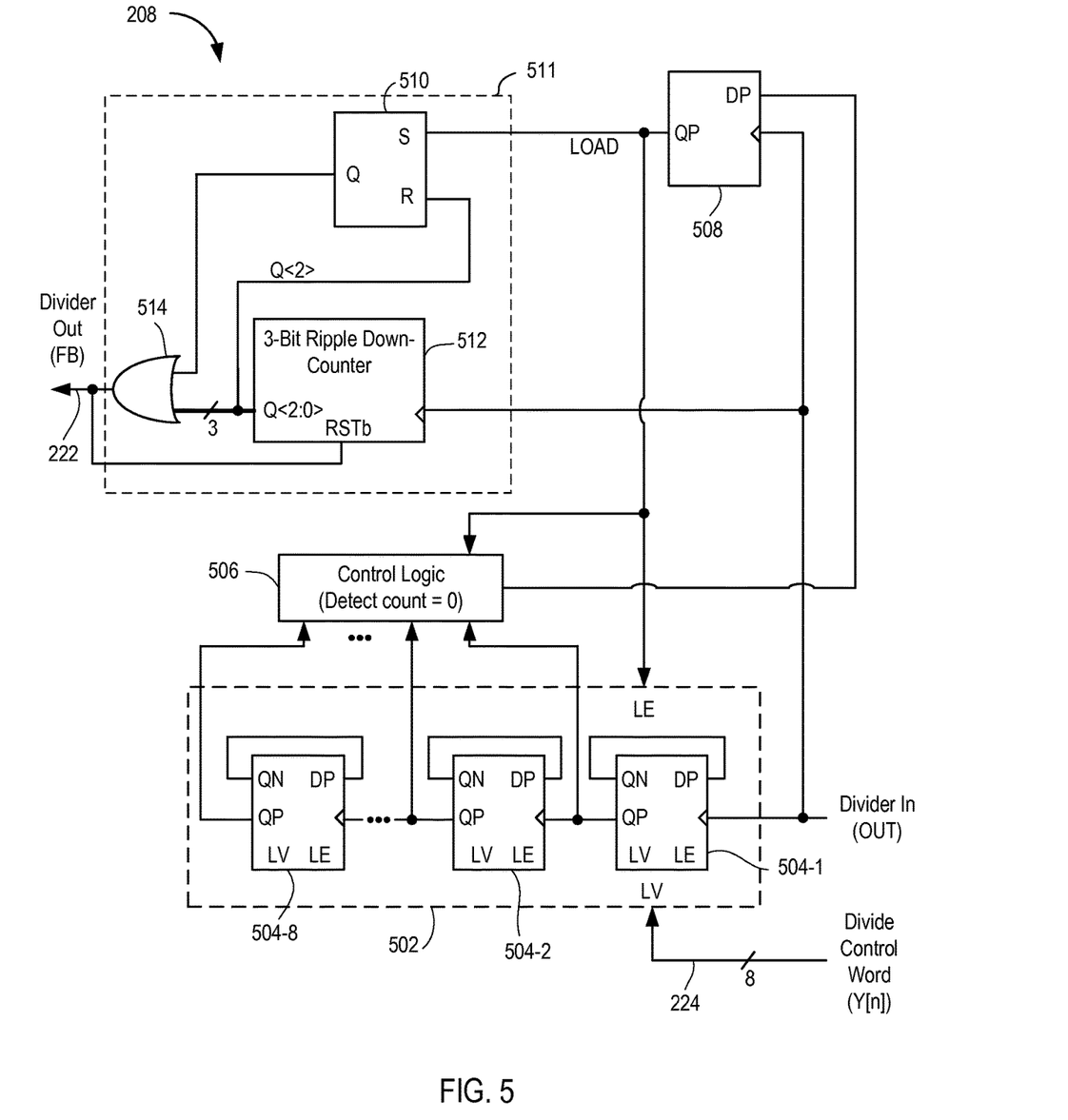
FIG. 5 is a block diagram depicting an example of a frequency divider for use with the PLL circuit of FIG. 2.

FIG. 5 is a block diagram depicting an example of the frequency divider 208. The frequency divider 208 includes a ripple down-counter 502, control logic 506, a flip-flop 508, a latch 510, a ripple down-counter 512, and an OR gate 514. The ripple down-counter 502 comprises a plurality of flip-flops 504. In the example, the ripple down-counter 502 is an 8-bit counter and includes eight flip-flops 504-1 through 504-8. The width of the ripple down-counter 502 matches the width of the divider control signal Y[n] provided by the SDM 209. Thus, the ripple down-counter 502 can have other widths and include other numbers of the flip-flops 504.

The frequency divider 208 includes a divider input (divider in), which is derived from the output signal OUT of the oscillator 204 having the frequency $F_{out}$. The divider input signal is a sequence of pulses at the frequency $F_{out}$. The divider input signal can be derived from a buffer or other circuit that receives the output signal OUT of the oscillator 204. The frequency divider 208 includes a divider output (divider out), which provides the feedback signal FB having the frequency $F_{fed}$. The frequency divider 208 also includes the input 224 to receive the divider control signal Y[n] from the SDM 209.

Each of the flip-flops 504 includes a clock input, a data input (DP), a true output (QP), a complement output (QN), a load value input (LV), and a load enable input (LE). The clock input of the flip-flop 504-1 (first flip-flop) is coupled to the divider input. The true output (QP) of the flip-flop 504-1 is coupled to the clock input of the next flip-flop 504-2; the true output (QP) of the flip-flop 504-2 is coupled to the clock input of the next flip-flop 504-3; and so on until the true output (QP) of the flip-flop 504-7 is coupled to the clock input of the last flip-flop 504-8. As such, the ripple down-counter 502 is an asynchronous logic block. For each of the flip-flops 504, the data input (DP) is coupled to the complement output (QN). The load value inputs (LV) of the flip-flops 504-1 through 504-8 are also coupled to receive respective bits of the divide control word (Y[n]) on the input 224 (e.g., the load value input (LV) of the flip-flop 504-1 receives Y[n]<0>, the load value input (LV) of the flip-flop 504-2 receives Y[n]<1>, and so on until the load value input (LV) of the flip-flop 504-8 receives Y[n]<7>). The load enable inputs (LE) of the flip-flops 504-1 through 504-8 are coupled to receive a load signal (LOAD) from the flip-flop 508. The ripple down-counter 502 is operable to load the flip-flops 504 with the respective bits of the divide control word (Y[n]) in response to assertion of the load signal (LOAD). When the load signal (LOAD) is de-asserted, the ripple down-counter 502 counts downward towards zero from the loaded value. The ripple down-counter 502 decrements once for each cycle of the divider input signal.

Inputs of the control logic 506 are coupled to the true outputs (QP) of the flip-flops 504. The control logic 506 is operable to detect when the ripple down-counter 502 reaches a count of zero (e.g., when each of the flip-flops 504 stores a logic '0'). An output of the control logic 506 is coupled to a data input (DP) of the flip-flop 508. The control logic 506 asserts its output (logic '1') upon detecting that the ripple down-counter 502 has reached zero.

The flip-flop 508 includes a clock input coupled to receive the divider input having the frequency $F_{out}$. When the control logic 506 asserts its output, the flip-flop 508 loads a logic '1' at the next cycle of the divider input signal. A true output (QP) of the flip-flop 508 provides a load signal LOAD. When the flip-flop 508 loads a logic '1', the load signal LOAD is asserted. The load signal LOAD is coupled to a set port (S) of the latch 510, a reset port of the control logic 506, and the load port of the ripple down-counter 502. When the load signal LOAD is asserted (logic '1'), the control logic 506 is reset and de-asserts its output, and the ripple down-counter 502 loads a divide control word Y[n]. Notably, the load signal LOAD is only asserted for approximately one period $T_{out}$ of the divider input signal. The logic '1' pulses of the load signal occur at a frequency of $F_{out}$ divided by the divider control word. As noted above, the SDM 209 varies the frequency of the divider control word Y[n] and thus the frequency of the pulses of the load signal LOAD varies slightly. In this manner, the frequency of the load signal LOAD on the average equals $F_{out}/N.F.$ The latch 510, the ripple down-counter 512, and the OR gate 514 form a pulse-width extension circuit 511. In the example, the ripple down-counter 512 comprises a 3-bit counter. In other examples, the ripple down-counter 512 can have other widths, depending on the desired extension of the load pulses. One input of the OR gate 514 is coupled to an output (Q) of the latch 510. A set of inputs of the OR gate 514 are coupled to an output bus (Q<2:0>) of the ripple down-counter 512. An output of the OR gate 514 provides the divider output. A reset input (R) of the latch 510 is coupled to receive the most significant bit (MSB) Q<2> output by the ripple down-counter 512. A reset_bar input (RSTb) of the ripple down-counter 512 is coupled to receive the divider output. As noted above, a set input (S) of the latch circuit 510 is coupled to receive the load signal LOAD.

The pulse-width extension circuit 511 operates to extend the pulse width of the load signal LOAD. As noted above, the width of the pulses of the load signal LOAD are commensurate with the period $T_{out}$ of the divider input signal. The period $T_{out}$ can be too short a duration to be used as the feedback signal FB by the error detector 202. Further, the period $T_{out}$ can be too short a duration to be used by the SDM 209 as the clock. The pulse width extension is determined by the width of the ripple down-counter 512. In the present example, the width of the ripple down-counter 512 is three bits, and thus the pulse width is extended by eight cycles of the divider input signal. For each pulse of the load signal LOAD, the latch 510 is set and the OR gate 514 asserts the divider output signal. Assertion of the divider output signal causes the ripple down-counter 512 to begin counting down from eight. When counting down, the output Q<2:0> causes the OR gate 514 to continue asserting the divider output even after the load signal LOAD has been de-asserted. Upon being reset, the MSB of the output Q<2:0> is set, which resets the latch 510. When the ripple down-counter 512 reaches a count of zero, the OR gate 514 de-asserts the divider output signal. When the divider output signal is de-asserted, the ripple down-counter 512 is held is reset and stops counting.

Figure 6:
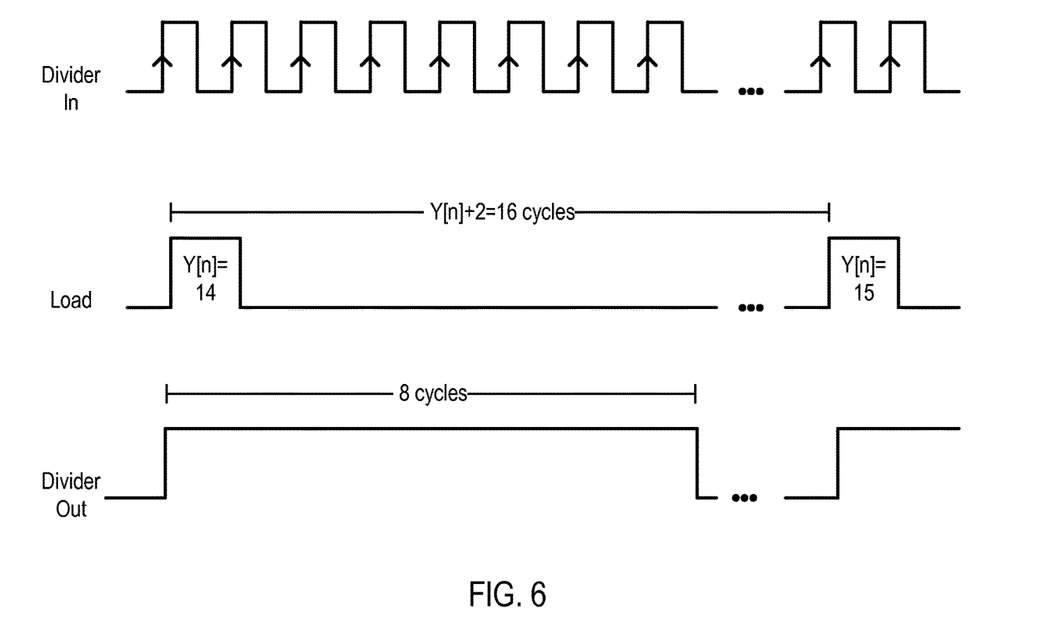
FIG. 6 shows example signals during operation of the frequency divider shown in FIG. 5.

FIG. 6 shows an example of the divider input, load, and divider output signals during operation of the frequency divider 208 shown in FIG. 5. As shown, the divider input signal (Divider In) includes a series of pulses at the output frequency $F_{out}$. Assume a divider value of Y[n]=14 followed by a divider value of Y[n]=15. A first pulse of the load signal LOAD causes the ripple down-counter 502 to load the value Y[n]=14. After Y[n]+2 cycles of the divider input signal (e.g., 16 cycles), the load signal LOAD is asserted again. Thus, the pulse that loads Y[n]=14 and the pulse that loads Y[n]=15 are separated by 16 cycles. The width of the pulses of the load signal LOAD is commensurate with the width of the pulses of the divider input signal. In contrast, the width of the pulses of the divider output signal is eight cycles of the divider input signal given that the width of the ripple down-counter 512 is three bits.

The frequency divider 208 shown in FIG. 5 provides a synchronous divider that can be implemented using complementary metal oxide semiconductor (CMOS) logic. The frequency divider 208 includes an asynchronous ripple down counter (the ripple down-counter 502) to achieve divide ratio range and flexibility. The frequency divider 208 includes a synchronizing flip-flop (the flip-flop 508) to generate the load signal LOAD, which leads to the generation of the pulse width extended output of the frequency divider 208. The delay from the frequency divider 208 input to its output is not dependent on the divide ratio or any cascaded divide stage. Rather, the delay is determined by the synchronizing flip-flop (the flip-flop 508), the SR latch 510, and the OR gate 514. The limited number of delay stages from the input to the output reduces jitter. Further, the pulse-width extension circuit 511 widens the pulse width to ensure the output pulse width is fixed. The pulse-width extension circuit 511 also decouples the output pulse width from process, voltage, and temperature (PVT) variations.

Figure 7:
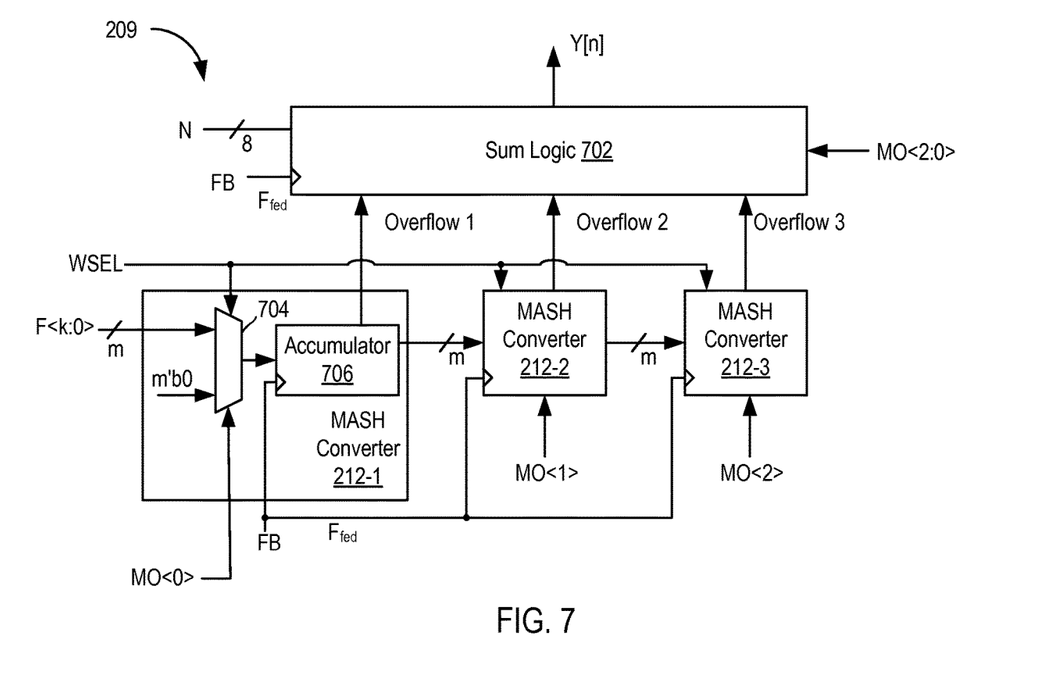
FIG. 7 is a block diagram depicting an example of a sigma-delta modulator (SDM)-based multi-stage noise shaping (MASH) circuit for use with the PLL circuit of FIG. 2.

FIG. 7 is a block diagram depicting an example of the SDM 209. The SDM 209 includes three MASH converters 212-1 through 212-3 and sum logic 702. An input of the MASH converter 212-1 is coupled to receive the signal F<k:0>. An output of the MASH converter 212-1 is coupled to an input of the MASH converter 212-2. An output of the MASH converter 212-2 is coupled to an input of the MASH converter 212-3. Clock inputs of the MASH converters 212-1 through 212-3 are coupled to receive the feedback signal FB. Width selection inputs of the MASH converters 212-1 through 212-3 are coupled to receive the width selection signal WSEL.

Each of the MASH converters 212-1 through 212-3 includes a multiplexer 704 and an accumulator 706. For clarity, only the MASH converter 212-1 is shown in detail. It is to be understood that the MASH converters 212-2 and 212-3 are configured similarly to the MASH converter 212-1. Inputs of the multiplexer 704 are coupled to receive a value to be accumulated (e.g., F<k:0> or an accumulator output from a prior stage) and a logic zero signal (m'b0). An output of the multiplexer 704 is coupled to an input of the accumulator 706. One output of the accumulator 706 provides the accumulated value, and another output of the accumulator 706 provides a carry bit (overflow bit). A clock input of the accumulator 706 is coupled to receive the feedback signal FB. One control input of the multiplexer 704 is coupled to receive the width selection signal WSEL. Another control input of the multiplexer 704 is coupled to receive a bit of the order select signal MO. The bits M<2:0> of the order select signal MO determine which of the MASH converters 212-1 through 212-3 are enabled (e.g., the order of the SDM 209).

Assume the SDM 209 is configured in the third (1-1-1) order. The MASH converter 212-1 adds the value F<k:0> to its accumulated value for each cycle of the feedback signal FB. The MASH converter 212-2 adds the accumulated value of the MASH converter 212-1 to its accumulated value for each cycle of the feedback signal FB. The MASH converter 212-3 adds the accumulated value of the MASH converter 212-2 to its accumulated value for each cycle of the feedback signal FB. The carry (overflow) bits of the MASH converters 212-1 through 212-3 are coupled to inputs of the sum logic 702 (designated overflow 1, overflow 2, and overflow 3). If any of the MASH converters 212-1 through 212-3 are disabled by the order select signal MO, then the respective carry (overflow) bits are zero.

The sum logic 702 has a clock input coupled to receive the feedback signal FB, an input to receive the integer value N, and an input coupled to receive the mash order signal (MO<2:0>). An output of the sum logic 702 provides the divider control signal Y[n]. The sum logic 702 combines the values of the overflows with the integer value N to generate the output value Y[n] for each cycle of the feedback signal FB. The mash order signal MO<2:0> determines the number of the MASH converters 212-1 through 212-3 used in the computation. For a first order computation, only the overflow 1 from the MASH converter 212-1 is used. For a second order computation, only the overflow 1 and overflow 2 from the MASH converters 212-1 and 212-2, respectively, are used. For a third order computation, all overflows 1, 2, and 3 are used. The value of Y[n] varies between N−O to N+O+1, where O is the selected order (e.g., O=1, 2, or 3 for first, second, or third order, respectively).

Figure 8:
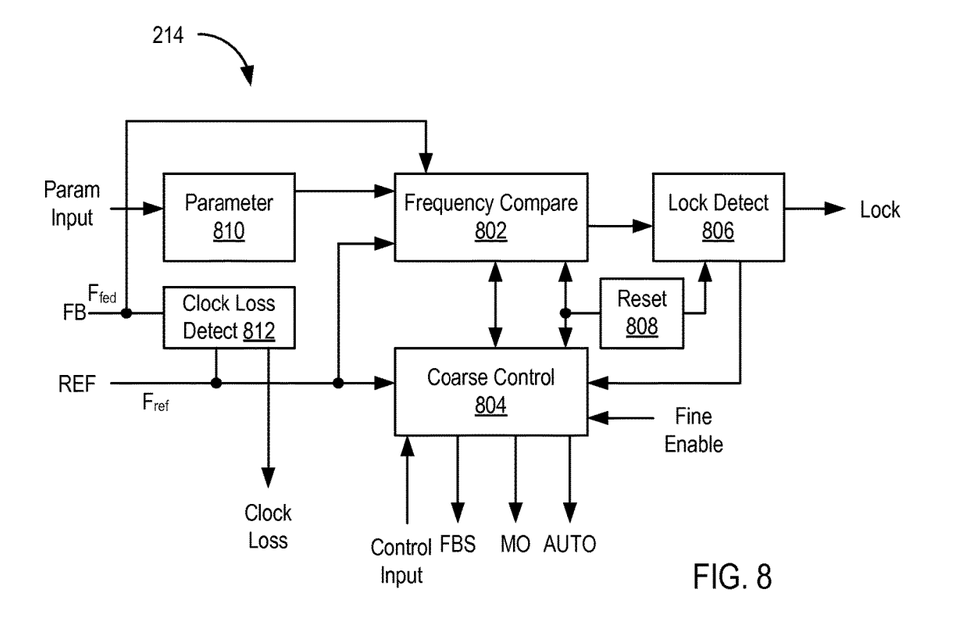
FIG. 8 is a block diagram depicting an example of a finite state machine (FSM) for use with the PLL circuit of FIG. 2.

FIG. 8 is a block diagram depicting an example of the FSM 214. The FSM 214 includes a frequency compare unit 802, a coarse control unit 804, a lock detect unit 806, a reset unit 808, a parameter unit 810, and a clock loss detect unit 812. The frequency compare unit 802 includes inputs coupled to receive the reference signal REF and the feedback signal FB. The frequency compare unit 802 is operable to compare the reference frequency $R_{ref}$ with the feedback frequency $F_{fb}$ and output a phase error. The frequency compare unit 802 outputs a phase error to both the lock detect unit 806 and the coarse control unit 804. The lock detect unit 806 can generate a lock signal (Lock) based on the phase error as determined by the frequency compare unit 802. The parameter unit 810 can include an input (Param Input) that specifies an accuracy for the frequency comparison performed by the frequency compare unit 802. The parameter unit 810 can include an output coupled to an input of the frequency compare unit 802 for setting the accuracy of the comparison operation.

The coarse control unit 804 is operable to provide the frequency band select signal FBS and the auto VCO selection signal AUTO to the oscillator 204 before PLL acquisition loop is enabled via a fine enable signal. The coarse control unit 804 can receive control input that can be used to select a particular frequency band, or to instruct the coarse control unit 804 to automatically select a frequency band. In the automatic mode, the coarse control unit 804 performs a binary hunt operation to select a particular frequency band for the oscillator 204 based on the phase error determined by the frequency compare unit 802. Once frequency hunting yields the correct frequency band, the coarse control unit 804 de-asserts the fine enable signal to initiate PLL acquisition. The fine enable signal can be held at a fixed voltage (can be programmable) value during VCO and VCO band selection.

The coarse control unit 804 can implement a plurality of states. The coarse control unit 804 can transition from one state to another state based on the various inputs described above. One state is referred to the "acquisition state". In the acquisition state, the coarse control unit 804 can generate one or more values for the frequency band select signal FBS coupled to the oscillator 204. The coarse control unit 804 can generate the FBS values automatically or in response to specific input receive through the control input. When in the acquisition state, the coarse control unit 804 can also set the mash order signal MO to select the first order for the SDM 209. This allows for fast acquisition of a selected output frequency for the PLL 108 during band hunting. Once band hunting is complete, the coarse control unit 804 can set the mash order signal MO to select a different order for the SDM 209, or can allow an external control input to provide the order for the SDM 209. For example, when in the FBS is fixed, the SDM 209 can be configured for the third order, allowing for increased accuracy and reduced jitter. This is done prior to de-asserting fine enable signal.

The reset unit 808 is configured to reset the frequency compare unit 802, the lock detect unit 806, and the coarse control unit 804 in response to a reset signal. The clock loss detect unit 812 is configured to assert a clock loss signal in response to loss of either the reference signal REF or the feedback signal FB.

Figure 9:
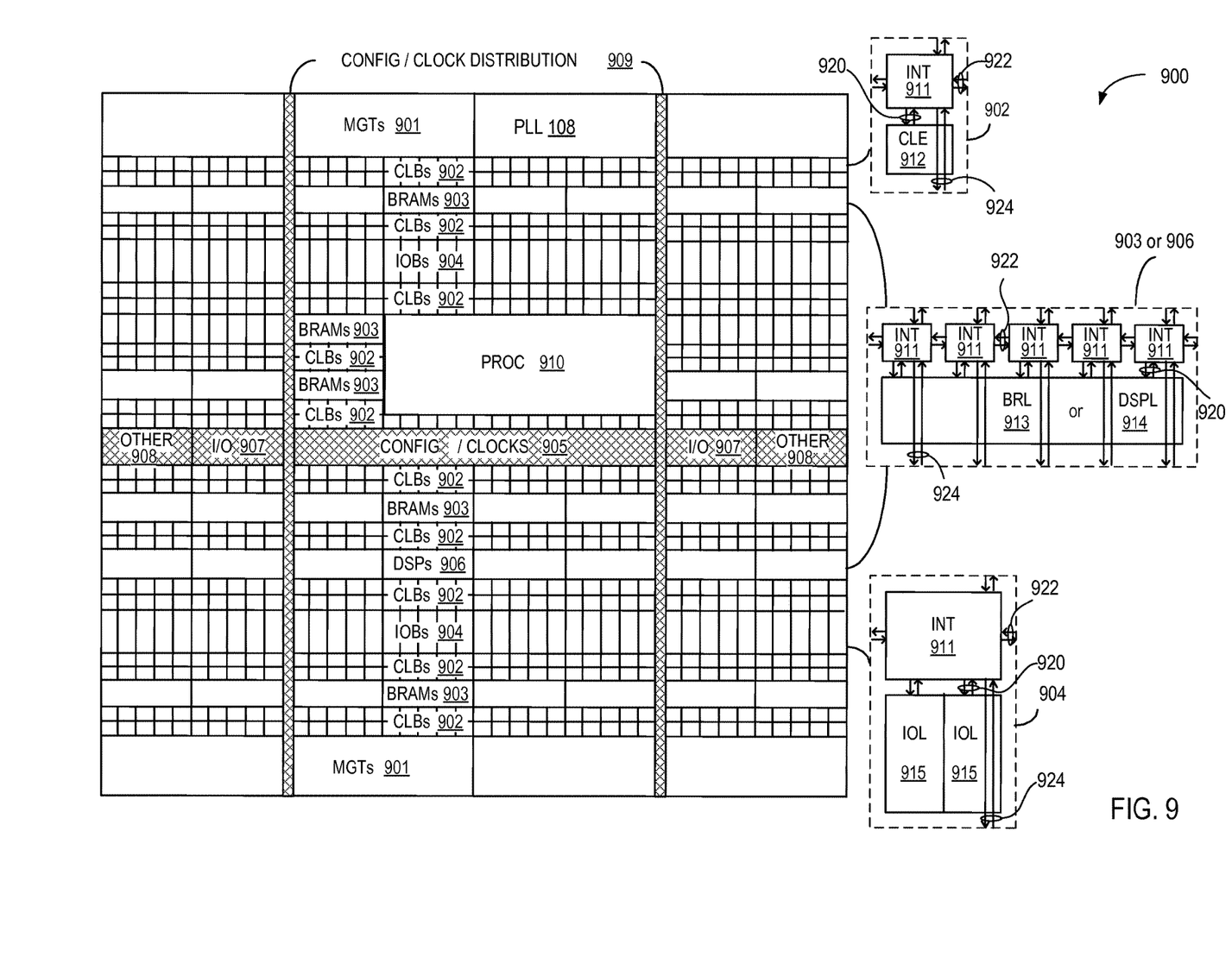
FIG. 9 illustrates an example architecture of a field programmable gate array (FPGA) that can use the PLL circuit of FIG. 2.

FIG. 9 illustrates an example architecture of an FPGA 900 that includes a large number of different programmable tiles including multi-gigabit transceivers ("MGTs") 901, configurable logic blocks ("CLBs") 902, random access memory blocks ("BRAMs") 903, input/output blocks ("IOBs") 904, configuration and clocking logic ("CONFIG/CLOCKS") 905, digital signal processing blocks ("DSPs") 906, specialized input/output blocks ("I/O") 907 (e.g., configuration ports and clock ports), and other programmable logic 908, such as digital clock managers, analog-to-digital converters, system monitoring logic, and so forth. Some FPGAs also include dedicated processor blocks ("PROC") 910.

In some FPGAs, each programmable tile can include at least one programmable interconnect element ("INT") 911 having connections to input and output terminals 920 of a programmable logic element within the same tile, as shown by examples included at the top of FIG. 9. Each programmable interconnect element 911 (also referred to as "interconnect element 911") can also include connections to interconnect segments 922 of adjacent programmable interconnect element(s) in the same tile or other tile(s). Each programmable interconnect element 911 can also include connections to interconnect segments 924 of general routing resources between logic blocks (not shown). The general routing resources can include routing channels between logic blocks (not shown) comprising tracks of interconnect segments (e.g., interconnect segments 924) and switch blocks (not shown) for connecting interconnect segments. The interconnect segments of the general routing resources (e.g., interconnect segments 924) can span one or more logic blocks. The programmable interconnect elements 911 taken together with the general routing resources implement a programmable interconnect structure ("programmable interconnect") for the illustrated FPGA. As described further below, in some examples, some or all of the interconnect elements 911 can include additional circuitry for efficient implementation of TCAMs.

In an example implementation, a CLB 902 can include a configurable logic element ("CLE") 912 that can be programmed to implement user logic plus a single programmable interconnect element ("INT") 911. A BRAM 903 can include a BRAM logic element ("BRL") 913 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 906 can include a DSP logic element ("DSPL") 914 in addition to an appropriate number of programmable interconnect elements. An IOB 904 can include, for example, two instances of an input/output logic element ("IOL") 915 in addition to one instance of the programmable interconnect element 911. As will be clear to those of skill in the art, the actual I/O pads connected, for example, to the I/O logic element 915 typically are not confined to the area of the input/output logic element 915.

In the pictured example, a horizontal area near the center of the die (shown in FIG. 9) is used for configuration, clock, and other control logic. Vertical columns 909 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 910 spans several columns of CLBs and BRAMs. The processor block 910 can include various components ranging from a single microprocessor to a complete programmable processing system of microprocessor(s), memory controllers, peripherals, and the like.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 910. In such an implementation, a System-on-Chip (Soc) can include a programmable fabric (programmable logic as shown in FPGA 900) in communication with a processing system.

In an example, the FPGA 900 can include one or more PLLs 108 as described above. The PLLs 108 can be used to provide clock signals to the MGTs 901. This allows the FPGA 900 to operate multiple MGTs 901 at different line rates that are not integer multiples of each other. The PLLs 108 can generate different clocks at fractional multiples using a single reference oscillator (not shown in FIG. 9). Since only a single reference oscillator is required, the PLLs 108 conserve valuable IO resources of the FPGA 900. The PLLs 108 can also be configured with different PPM accuracy requirements as may be dictated by the different applications of the MGTs 901.

Figure 10:
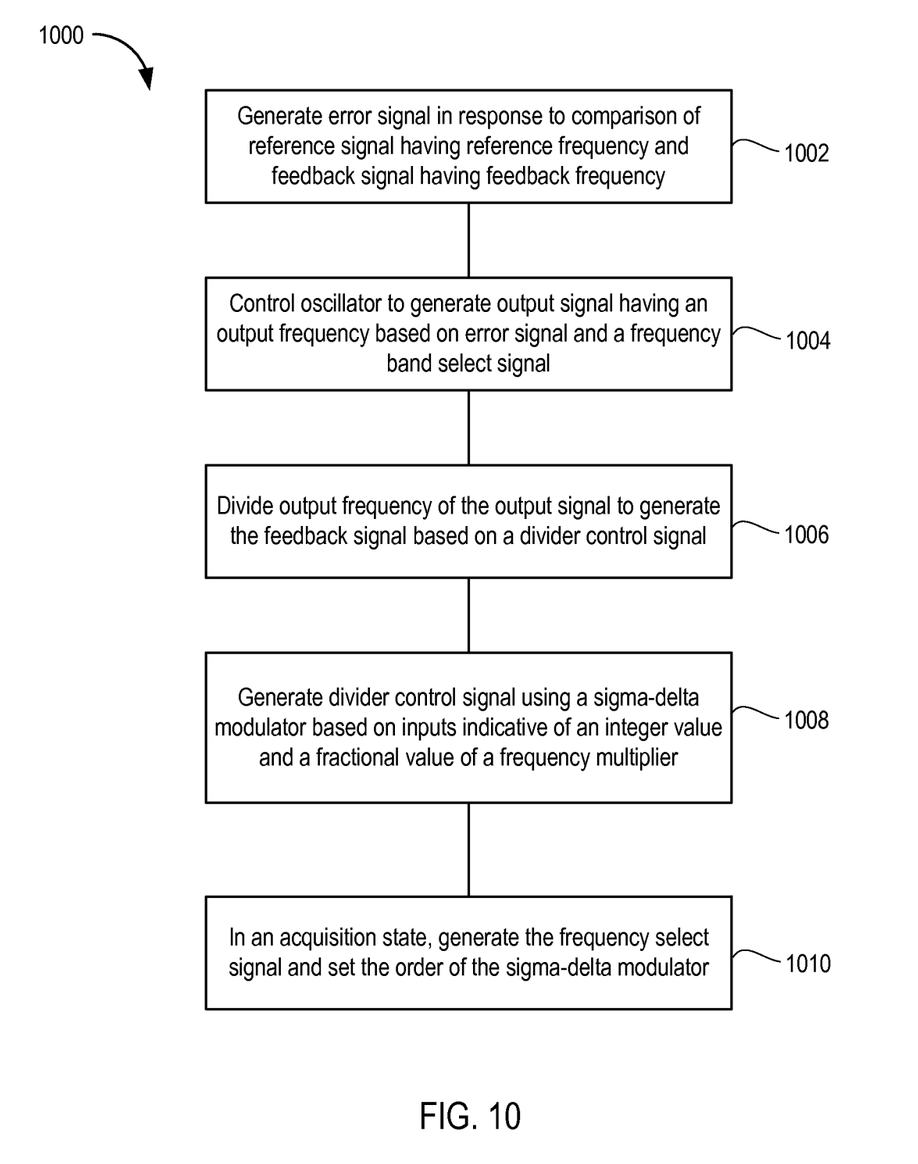
FIG. 10 is a flow diagram depicting an example method of operating a PLL circuit.

FIG. 10 is a flow diagram depicting an example method 1000 of operating a PLL circuit. The method 1000 can be performed by the PLL circuit 108 described above. At operation 1002, the PLL circuit 108 generates an error signal in response to comparison of a reference signal having a reference frequency and a feedback signal having a feedback frequency. At operation 1004, the PLL circuit 108 controls an oscillator to generate an output signal having an output frequency based on the error signal and a frequency band select signal. At operation 1006, the PLL circuit 108 divides the output frequency of the output signal to generate the feedback signal based on a divider control signal. At operation 1008, the PLL circuit 108 generates the divider control signal using a SDM based on inputs indicative of an integer value and a fractional value of a frequency multiplier. At operation 1010, the PLL 108, in an acquisition state, generates the frequency band select signal and sets the order of the SDM.

While the foregoing is directed to specific examples, other and further examples may be devised without departing from the basic scope thereof, and the scope thereof is determined by the claims that follow.

What is claimed is:

1. A phase-locked loop (PLL) circuit, comprising:
an error detector operable to generate an error signal in response to comparison of a reference signal having a reference frequency and a feedback signal having a feedback frequency;
an oscillator, coupled to the error detector, operable to provide an output signal having an output frequency based on the error signal and a frequency band select signal, the output frequency being a frequency multiplier times the reference frequency;
a frequency divider, coupled to the oscillator, operable to divide the output frequency of the output signal to generate the feedback signal based on a divider control signal;
a sigma-delta modulator (SDM), coupled to the frequency divider, operable to generate the divider control signal based on inputs indicative of an integer value and a fractional value of the frequency multiplier, the SDM including a plurality of stages that are selectively enabled responsive to an order select signal operable to select an order of the SDM; and
a state machine operable to generate the frequency band select signal and set the order of the SDM through the order select signal, the state machine configured to set the SDM to a first order for an acquisition state to provide for faster acquisition of the output frequency, and subsequent to the acquisition state, set the SDM to a greater than first order to provide for increased accuracy of the output frequency.

2. The PLL circuit of claim 1, wherein the state machine is operable to change the order of the SDM to a first order in the acquisition state, and wherein the state machine is operable to set the order of the SDM to a selected order in a lock state.

3. The PLL circuit of claim 1, wherein the error detector comprises:

a phase-frequency detector (PFD) coupled to receive the reference signal and the feedback signal;
a charge pump coupled to receive output of the PFD; and
a low-pass filter (LPF) coupled to receive output of the charge pump and to provide the error signal.

4. The PLL circuit of claim 3, wherein the charge pump comprises:
at least one charge pump circuit each having a pair of current sources; and
a bias circuit operable to bias the pair of current sources in each of the at least one charge pump circuit.

5. The PLL circuit of claim 4, wherein each of the at least one charge pump circuit comprises:
a current-steering circuit coupled between the respective pair of current sources, the current steering circuit having a pair of differential inputs coupled to the output of the PFD and a differential output; and
a differential amplifier having inputs coupled to ends of the differential output of the current-steering circuit, respectively, and an output coupled to a first end of the differential output of the current-steering circuit;
wherein a second end of the differential output of the current-steering circuit is coupled to the LPF.

6. The PLL of claim 5, wherein the bias circuit comprises:
a reference circuit operable to generate a reference voltage; and
a differential amplifier having inputs coupled to receive the reference voltage and a voltage across a capacitor in the LPF, respectively, and having an output coupled to one current source in the pair of current sources in each of the at least one charge pump circuit.

7. The PLL circuit of claim 1, wherein the plurality of stages comprises a plurality of cascaded multi-stage noise shaping (MASH) converters, where an input MASH converter is coupled to receive the input indicative of the fractional value; and wherein the SDM comprises:
a sum circuit, coupled to the plurality of MASH converters, operable to sum the input indicative of the integer value with a value derived from output of a selected number of the MASH converters, the selected number based on the order select signal.

8. The PLL circuit of claim 1, wherein the oscillator comprises at least one voltage controlled oscillator (VCO).

9. The PLL circuit of claim 1, wherein the state machine comprises:
a frequency compare unit operable to compare the reference signal with the feedback signal;
a coarse control unit operable to select a frequency band of a plurality of frequency bands of the oscillator through the frequency band select signal based at least in part on output of the frequency compare unit; and
a lock detect unit operable to detect a lock state of the PLL.

10. The PLL circuit of claim 1, wherein the frequency divider comprises:
a ripple down-counter coupled to receive an input clock derived from the output signal of the oscillator and a divider value derived from the divider control signal, the ripple down-counter loading the divider value in response to a load signal;
a control circuit operable to detect when the ripple down-counter reaches zero;
a flip-flop having a data input coupled to an output of the control circuit, data output providing the load signal, and a clock input coupled to receive the input clock; and a pulse-width extension circuit coupled to receive the input clock and the load signal and operable to generate the feedback signal.

11. The PLL circuit of claim 10, wherein the pulse-width extension circuit comprises:
   another ripple down-counter having a clock port coupled to receive the input clock, an output port, and a reset port;
   a set-reset (SR) latch having a set port coupled to receive the load signal, a reset port coupled to the output port of the other ripple down-counter, and an output port; and
   an OR gate having a first input port coupled to the output port of the SR latch, a second input port coupled to the output of the other ripple down-counter, and an output port coupled to the reset port of the other ripple down-counter and providing the feedback signal.

12. An integrated circuit (IC), comprising:
   at least one transceiver;
   an input operable to receive a reference signal having a reference frequency from a reference oscillator; and
   a phase-locked loop (PLL), coupled to each of the at least one transceiver, the PLL comprising:
      an error detector operable to generate an error signal in response to comparison of the reference signal and a feedback signal having a feedback frequency;
      an oscillator, coupled to the error detector, operable to provide an output signal having an output frequency based on the error signal and a frequency band select signal, the output frequency being a frequency multiplier times the reference frequency;
      a frequency divider, coupled to the oscillator, operable to divide the output frequency of the output signal to generate the feedback signal based on a divider control signal;
      a sigma-delta modulator (SDM), coupled to the frequency divider, operable to generate the divider control signal based on inputs indicative of an integer value and a fractional value of the frequency multiplier, the SDM including a plurality of stages that are selectively enabled responsive to an order select signal operable to select an order of the SDM; and
      a state machine operable to generate the frequency band select signal and set the order of the SDM through the order select signal, the state machine configured to set the SDM to a first order for an acquisition state to provide for faster acquisition of the output frequency, and subsequent to the acquisition state, set the SDM to a greater than first order to provide for increased accuracy of the output frequency.

13. The IC of claim 12, wherein the state machine is operable to change the order of the SDM to a first order in the acquisition state, and wherein the state machine is operable to set the order of the SDM to a selected order in a lock state.

14. The IC of claim 12, wherein the error detector comprises:
   a phase-frequency detector (PFD) coupled to receive the reference signal and the feedback signal;
   a charge pump coupled to receive output of the PFD; and
   a low-pass filter (LPF) coupled to receive output of the charge pump and to provide the error signal.

15. The IC of claim 14, wherein the charge pump comprises:
   at least one charge pump circuit each having a pair of current sources; and
   a bias circuit operable to bias the pair of current sources in each of the at least one charge pump circuit;
   wherein each of the at least one charge pump circuit comprises:
      a current-steering circuit coupled between the respective pair of current sources, the current steering circuit having a pair of differential inputs coupled to the output of the PFD and a differential output; and
      a differential amplifier having inputs coupled to ends of the differential output of the current-steering circuit, respectively, and an output coupled to a first end of the differential output of the current-steering circuit;
      wherein a second end of the differential output of the current-steering circuit is coupled to the LPF.

16. The IC claim 15, wherein the bias circuit comprises:
   a reference circuit operable to generate a reference voltage; and
   a differential amplifier having inputs coupled to receive the reference voltage and a voltage across a capacitor in the LPF, respectively, and having an output coupled to one current source in the pair of current sources in each of the at least one charge pump circuit.

17. The IC of claim 12, wherein the state machine comprises:
   a frequency compare unit operable to compare the reference signal with the feedback signal;
   a coarse control unit operable to select a frequency band of a plurality of frequency bands of the oscillator through the frequency band select signal based at least in part on output of the frequency compare unit; and
   a lock detect unit operable to detect a lock state of the PLL.

18. The IC of claim 12, wherein the frequency divider comprises:
   a ripple down-counter coupled to receive an input clock derived from the output signal of the oscillator and a divider value derived from the divider control signal, the ripple down-counter loading the divider value in response to a load signal;
   a control circuit operable to detect when the ripple down-counter reaches zero;
   a flip-flop having a data input coupled to an output of the control circuit, data output providing the load signal, and a clock input coupled to receive the input clock; and
   a pulse-width extension circuit coupled to receive the input clock and the load signal and operable to generate the feedback signal.

19. The IC of claim 18, wherein the pulse-width extension circuit comprises:
   another ripple down-counter having a clock port coupled to receive the input clock, an output port, and a reset port;
   a set-reset (SR) latch having a set port coupled to receive the load signal, a reset port coupled to the output port of the other ripple down-counter, and an output port; and
   an OR gate having a first input port coupled to the output port of the SR latch, a second input port coupled to the output of the other ripple down-counter, and an output port coupled to the reset port of the other ripple down-counter and providing the feedback signal.

20. A method of operating a phase locked loop (PLL) circuit, comprising:

generating an error signal in response to comparison of a reference signal having a reference frequency and a feedback signal having a feedback frequency;

controlling an oscillator to generate an output signal having an output frequency based on the error signal and a frequency band select signal, the output frequency being a frequency multiplier times the reference frequency;

dividing the output frequency of the output signal to generate the feedback signal based on a divider control signal;

generating the divider control signal using a sigma-delta modulator (SDM) based on inputs indicative of an integer value and a fractional value of the frequency multiplier, the SDM responsive to an order select signal operable to select an order of the SDM;

in an acquisition state, generating the frequency band select signal and setting the order of the SDM to a first order for faster acquisition of the output frequency by selectively enabling a plurality of stages of the SDM through the order select signal; and subsequent to the acquisition state, generating the frequency band select signal and setting the order of the SDM to greater than the first order for increased accuracy of the output frequency by selectively enabling a plurality of stages of the SDM through the order select signal.

\* \* \* \* \*

UNITED STATES PATENT AND TRADEMARK OFFICE
CERTIFICATE OF CORRECTION

PATENT NO. : 10,623,008 B2  
APPLICATION NO. : 14/700695  
DATED : April 14, 2020  
INVENTOR(S) : Parag Upadhyaya Page 1 of 1

It is certified that error appears in the above-identified patent and that said Letters Patent is hereby corrected as shown below:

In the Claims

Column 16, Line 25, Claim 6, after "PLL" insert -- circuit --.

Column 18, Line 18, Claim 16, after "IC" insert -- of --.

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*